United States Patent [19]
Allen et al.

[11] Patent Number: 6,165,678
[45] Date of Patent: *Dec. 26, 2000

[54] LITHOGRAPHIC PHOTORESIST COMPOSITION AND PROCESS FOR ITS USE IN THE MANUFACTURE OF INTEGRATED CIRCUITS

[75] Inventors: Robert David Allen; Richard Anthony DiPietro; Ratnam Sooriyakumaran, all of San Jose; Thomas I. Wallow, Union City; Gregory Michael Wallraff, Morgan Hill, all of Calif.

[73] Assignee: International Business Machines Corporation, Armonk, N.Y.

[ * ] Notice: This patent is subject to a terminal disclaimer.

[21] Appl. No.: 09/111,558

[22] Filed: Jul. 8, 1998

Related U.S. Application Data

[63] Continuation-in-part of application No. 08/928,308, Sep. 12, 1997.

[51] Int. Cl.[7] ...................................................... G03F 7/004
[52] U.S. Cl. ........................ 430/270.1; 430/905; 430/910
[58] Field of Search ................................. 430/270.1, 905, 430/910

[56] References Cited

U.S. PATENT DOCUMENTS

| | | |
|---|---|---|
| 5,071,730 | 12/1991 | Allen et al. . |
| 5,399,647 | 3/1995 | Nozaki ..................................... 526/297 |
| 5,585,219 | 12/1996 | Kaimoto et al. ...................... 430/270.1 |
| 5,910,392 | 6/1999 | Nozaki et al. ........................ 430/270.1 |
| 5,968,713 | 10/1999 | Nozaki et al. ........................... 430/326 |

OTHER PUBLICATIONS

Abe et al. (1995), "Study of ArF Resistance Material in Terms of Transparency and Dry Etch Resistance," *J. Photopolym. Sci. and Tech.* 8(4):637–642.

Allen et al. (1995), "Resolution and Etch Resistance of a Family of 193 nm Positive Resists," *J. Photopolym. Sci. and Tech.* 8(4):623–636.

Nozaki et al. (1993), *J. Photopolym. Sci. Technol.* 9:509–522.

*Primary Examiner*—John S. Chu
*Attorney, Agent, or Firm*—Dianne E. Reed; Reed & Associates

[57] ABSTRACT

A novel radiation-sensitive lithographic photoresist composition is provided which has improved sensitivity and resolution. The composition comprises a photosensitive acid generator and an acrylate or methacrylate copolymer. The copolymer contains first monomeric units having polar pendant groups and second monomeric units containing photoacid-cleavable ester groups. The polar pendant groups preferably comprise $C_6$–$C_{12}$ alicyclic substituents containing a polar moiety R*, wherein the alicyclic substituents are bound through a linker moiety to the polymer backbone. Other monomeric units may be included as well. A process for using the composition to generate resist images on a substrate, i.e., in the manufacture of integrated circuits or the like.

18 Claims, No Drawings

LITHOGRAPHIC PHOTORESIST COMPOSITION AND PROCESS FOR ITS USE IN THE MANUFACTURE OF INTEGRATED CIRCUITS

CROSS-REFERENCE TO RELATED APPLICATIONS

This is a continuation-in-part of U.S. patent application Ser. No. 08/928,308, entitled "Photoresist Composition and Process for Its Use," filed Sep. 12, 1997, now allowed.

TECHNICAL FIELD

This invention relates generally to an improved lithographic photoresist composition and a process for its use in the manufacture of integrated circuits.

BACKGROUND

There is a desire in the industry for higher circuit density in microelectronic devices which are made using lithographic techniques. One method of increasing the number of components per chip is to decrease the minimum feature size on the chip, which requires higher lithographic resolution. The use of shorter wavelength radiation than the currently employed mid-ultraviolet spectral range (e.g., 248–450 nm) offers the potential for higher resolution. Ultra-deep ultraviolet radiation, particularly, 193 nm, has been proposed. See, for example, Allen et al. (1995), "Resolution and Etch Resistance of a Family of 193 nm Positive Resists," *J. Photopolym. Sci. and Tech.* 8(4):623–636, and Abe et al. (1995), "Study of ArF Resistant Material in Terms of Transparency and Dry Etch Resistance," *J. Photopolym. Sci. and Tech.* 8(4):637–642. However, with deep UV radiation, fewer photons are transferred for the same energy dose and higher exposure doses are required to achieve the same desired photochemical response. Further, current lithographic photoresist compositions (also sometimes termed "resist compositions" or "resists") absorb strongly at 193 nm as a result of their aromaticity, making them unsuitable for commercial use at 193 nm.

Acrylate and methacrylate resists are known in the art. For example, U.S. Pat. No. 5,071,730 to Allen et al. discloses a resist comprising a terpolymer of methyl methacrylate, t-butyl methacrylate and methacrylic acid. Allen teaches that the t-butyl group imparts acid sensitivity, the acid group influences development rate, and the methyl ester increases toughness of the film. Although this resist is suitable for some commercial uses, it is deficient in that it has low reactive ion etch resistance. Reactive ion etch resistance is desired for processing in semiconductor manufacturing. Further, excessive amounts of acid in the polymer will result in thinning in the unexposed areas during development.

Nozaki et al. (1993), *J. Photopolym. Sci. Technol.* 9:509, discloses a methacrylate resist having two acid-cleavable ester groups, adamantyl and pyranyl groups. The authors state that the resist develops well probably due to the high acid content of the exposed areas resulting from the cleavage of both leaving groups. However, the unexposed areas of the resist will experience substantial cracking during postexposure bake due to the large shrinkage in the exposed area upon removal of the large ester groups.

The requirements for photoresists for semiconductor manufacturing include etch resistance, clean aqueous development and compatibility with strong developers currently in use in semiconductor manufacturing. Traditional DUV resists (248 nm) combine these functions quite easily by using poly(hydroxystyrene), a phenolic resin, as the polymer of choice. This material has unacceptably high optical density for 193-nm lithography. Combining these requirements in a polymer that is nearly transparent at both 193 nm and 248 nm is a significant challenge.

SUMMARY OF THE INVENTION

Accordingly, it is a primary object of the invention to address the above-described need in the art by providing a novel radiation-sensitive lithographic photoresist composition which has improved sensitivity and resolution.

It is another object of the invention to provide such a composition containing an acrylate or methacrylate copolymer.

It is a further object of the invention to provide such a composition containing an acrylate or methacrylate copolymer having both (1) pendant groups that are cleavable by a photogenerated acid, e.g., acid-cleavable ester functionalities, and (2) pendant groups containing an organic polar moiety that is (a) generally not cleavable in the presence of the photogenerated acid, and (b) non-acidic and non-hydroxylic.

It is an additional object of the invention to provide a method for generating a resist image on a substrate using a photoresist composition as described herein.

Additional objects, advantages and novel features of the invention will be set forth in part in the description which follows, and in part will become apparent to those skilled in the art upon examination of the following, or may be learned by practice of the invention.

In one embodiment, the present invention relates to a novel radiation-sensitive lithographic photoresist composition comprising a photosensitive acid generator and an acrylate or methacrylate copolymer. The copolymer is comprised of a first monomeric unit (I) containing a pendant substituent $R_p$, and a second monomeric unit (II) containing a pendant substituent $R_{cl}$,

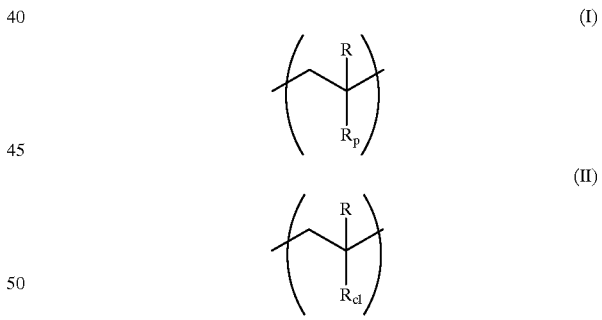

wherein, in structure (I):

R is hydrido or methyl; and $R_p$ is either

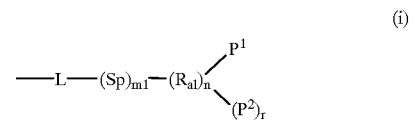

wherein L is a linking moiety such as —C(O)O—, —C(O)—, —O—C(O)—C(O)—O—, or —OC(O)—, and is preferably —C(O)O—, Sp is a spacer such as alkylene, cycloalkylene or oxyalkylene optionally substituted with a lower alkoxy group or a lower alkyl ester, m1 is 0 or 1, $R_{al}$ is a saturated alicyclic moiety containing 6 to 12 carbon atoms, n is 0 or 1, $P^1$ and $P^2$ may be the same or different and are each defined as -$(Sp)_{m2}$-$R^*$, m2 is 0 or 1, r is 0 or 1, and $R^*$ is a polar organic group which is acid-stable, non-acidic and non-hydroxylic, and contains a heteroatom with a Pauling electronegativity greater than about 3.00, or wherein $P^1$ and $P^2$ are linked to form a cyclic structure containing $R^*$, (ii) —C(O)—$NR^1R^2$ wherein $R^1$ and $R^2$ are independently selected from the group consisting of hydrogen, lower alkyl and -$(Sp)_{m1}$-$(R_{al})_n$-$(Sp)_{m2}$-$R^*$ wherein Sp, $R_{al}$, $R^*$, m1, m2 and n are as defined above, or (iii) —CN.

In structure (II),

R is hydrido or methyl, as above; and $R_{cl}$ comprises a photoacid-cleavable ester substituent.

The copolymer may contain additional monomer units as well, e.g., acrylic acid units, methacrylic acid units, hydroxystyrene units, silicon-containing acrylate or methacrylate units, and/or monomer units similar to (1) but containing non-alicyclic groups rather than $R_{al}$ as defined above. These latter monomer units are represented as structure (III)

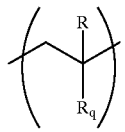

(III)

wherein $R_q$ is

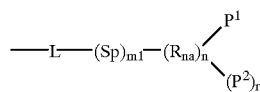

or —CN, $R_{na}$ is a non-alicyclic substituent, and L, Sp, m1, n, r, $P^1$ and $P^2$ are as defined above for the substituents of formula (I).

The present invention also relates to the use of the resist composition to make integrated circuits. The process involves the steps of (a) coating a substrate with a film comprising a radiation-sensitive acid generator and a copolymer as described above; (b) exposing the film selectively to a predetermined pattern of radiation to form a latent image therein; and (c) developing the image using a suitable developer composition. Step (b) involves the use of x-ray, electron beam or ultraviolet radiation, preferably ultraviolet radiation having a wavelength in the range of approximately 13 to 250 nm, more preferably 193 nm.

DETAILED DESCRIPTION OF THE INVENTION

Overview and Definitions

Before describing the present invention in detail, it is to be understood that this invention is not limited to specific compositions, components or process steps, as such may vary. It is also to be understood that the terminology used herein is for the purpose of describing particular embodiments only, and is not intended to be limiting.

It must be noted that, as used in this specification and the appended claims, the singular forms "a," "an" and "the" include plural referents unless the context clearly dictates otherwise. Thus, for example, reference to "a monomer having structure (I)" includes a combination of two or more monomers encompassed by structure (I), a "photosensitive acid generator" includes a mixture of two or more such compounds, and the like.

In describing and claiming the present invention, the following terminology will be used in accordance with the definitions set out below.

The term "alkyl" as used herein refers to a branched or unbranched saturated hydrocarbon group of 1 to 24 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. The term "lower alkyl" intends an alkyl group of one to six carbon atoms, preferably one to four carbon atoms, and the term "lower alkyl ester" refers to an ester functionality —C(O)O—R wherein R is lower alkyl.

The term "alkoxy" as used herein refers to a substituent —O—R wherein R is alkyl. The term "lower alkoxy" refers to such a group wherein R is lower alkyl.

The term "alkylene" as used herein refers to a difunctional branched or unbranched saturated hydrocarbon group of 1 to 24 carbon atoms, such as methylene, ethylene, n-propylene, n-butylene, n-hexylene, decylene, tetradecylene, hexadecylene, or the like. The term "lower alkylene" refers to an alkylene group of one to six carbon atoms, preferably one to four carbon atoms. "Cycloalkylene" refers to a cyclic alkylene group containing 3 to 8 carbon atoms.

The term "oxyalkylene" as used herein refers to a difunctional branched or unbranched saturated hydrocarbon group of 2 to 24 carbon atoms containing one to three ether linkages —O—. Preferred oxyalkylene substituents herein are lower oxyalkylene, i.e., they contain 2 to 6, preferably 2 to 4, carbon atoms, and a single ether linkage —O—.

The term "non-acidic" refers to a molecular moiety which does not contain any functional groups bearing hydrido substituents having an aqueous $pK_a$ of less than about 7.0, e.g., carboxylic acid moieties.

The term "non-hydroxylic" refers to a molecular moiety which does not contain any hydroxyl groups.

The terms "photogenerated acid" and "photoacid" are used interchangeably herein to refer to the acid that is created upon exposure of the present compositions to radiation, i.e., as a result of the radiation-sensitive acid generator in the compositions.

For additional information concerning terms used in the field of litography and lithographic compositions, reference may be had to *Introduction to Microlithography*, Eds. Thompson et al. (Washington, D.C.: American Chemical Society, 1994).

The present invention relates to a radiation-sensitive composition comprising (a) a photosensitive acid generator; and (b) an acrylate or methacrylate copolymer having both (1) pendant groups that are cleavable by a photogenerated acid, and (2) pendant groups containing a polar moiety that (a) is generally not cleaved in the presence of the photogenerated acid, and (b) is non-acidic and non-hydroxylic. The composition is useful as a chemically amplified, positive tone, lithographic photoresist.

The Copolymer

The copolymer in the resist composition is comprised of a first monomeric unit (I) and a second monomeric unit (II)

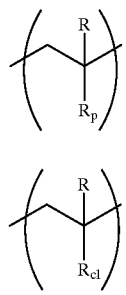

(I)

(II)

Monomeric unit (I) contains a pendant group $R_p$ containing an organic polar moiety which is generally not cleaved or otherwise chemically modified upon contact with the photoacid generated during exposure of the composition to radiation (i.e., because it cannot form a stable carbonium ion in acid), and which is both non-acidic and non-hydroxylic. By "generally" not cleaved is meant that the fraction of monomers in which $R_p$ is cleaved upon contact with the photoacid is small enough so as not to impact the lithographic process in any significant way; typically, this fraction is less than 15%, preferably less than 10%, and most preferably less than 5%. The polarity of the substituent $R_p$ enhances the development of the resist without causing problems associated with excessive acid content. Monomeric unit (II) contains a pendant substituent $R_{cl}$ which in turn comprises a photoacid-cleavable group, typically a photoacid-cleavable ester substituent. The substituent "R" in both monomers may be either hydrogen or methyl.

In formula (I), the polar pendant group $R_p$ may be

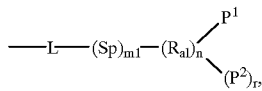

—C(O)—NR$^1$R$^2$ or —CN. L, Sp, $R_{al}$, m1, m2, n, r, P$^1$, P$^2$, R$^1$ and R$^2$ may be defined as follows.

"L" is a linking moiety between the polymer backbone and the pendant group, and will generally be —C(O)O—, —C(O)—, —O—C(O)—C(O)—O—, or —OC(O)—. Preferably, L is —C(O)O—.

"Sp" is a spacer such as alkylene, cycloalkylene or oxyalkylene, preferably lower alkylene or lower oxyalkylene, optionally substituted with a lower alkoxy group or a lower alkyl ester. Also, m1 is 0 or 1, such that the spacer group may or may not be present.

"$R_{al}$" is a saturated alicyclic moiety containing 6 to 12 carbon atoms, and n is 0 or 1, such that the alicyclic moiety may or may not be present. Examples of suitable $R_{al}$ groups include, but are not limited to, the following.

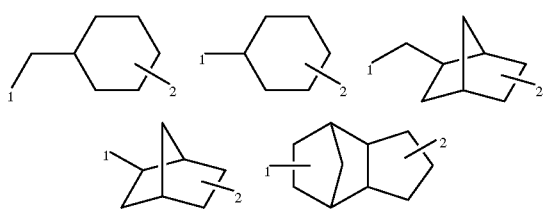

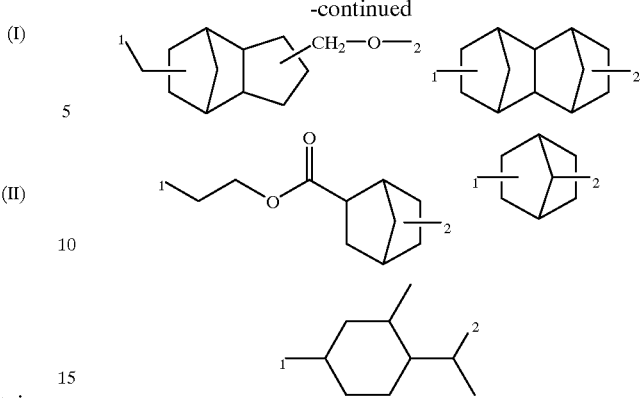

In the above structures, "1" indicates the point of attachment to -(L)-(Sp)$_{m1}$ and "2" indicates the point of attachment to either P$^1$ or P$^2$. It will be appreciated by those skilled in the art, of course, that derivatives, analogs, variations and isomeric mixtures of the above structures are suitable as well, as are any and all other $C_6$–$C_{12}$ saturated alicyclic moieties. The invention is not to be construed as limited to monomers containing the specific $R_{al}$ moieties illustrated above.

P$^1$ and P$^2$ may be the same or different and are defined as -(Sp)$_{m2}$-R*, in which m2 is 0 or 1, Sp is as defined above, R* is a polar group as will be explained below, and r is 0 or 1. Alternatively, P$^1$ and P$^2$ may be linked to form a cyclic substituent containing R*, e.g., a cyclic ether, a lactone, a cyclic carbonate, an anhydride, or the like.

R* is a polar organic group that is acid-stable, non-acidic and non-hydroxylic, and contains a heteroatom with a Pauling electronegativity greater than about 3.00. Suitable R* include: mono-, di-, tri- and tetra-alkoxy; alkyl carbonyl; mono-, di-, tri- and tetra-alkoxy carbonyl; mono-, di-, tri- and tetra-alkoxy alkylcarbonyl; alkylcarbonyloxy; mono-, di-, tri- and tetra-alkoxy alkylcarbonyloxy; mono-, di-, tri- and tetra-alkoxy carbonyloxy; alkyl dicarbonyloxy, mono-, di-, tri- and tetra-alkoxy dicarbonyloxy; mono-, di-, tri- and tetra-alkoxyalkyl dicarbonyloxy; amino; alkylamino; mono-, di-, tri- and tetra-alkoxy alkylamino; alkyl carbonyl amino and alkyl sulfonyl amino where each alkyl is preferably lower alkyl and each alkoxy is preferably lower alkoxy; and cyano.

Other suitable polar substituents R* include cycloalkylcarbonylamino (lactams, e.g., caprolactam):

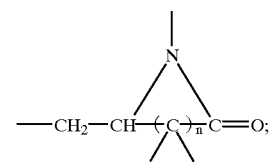

cycloalkylcarbonyloxyalkyl (lactones, e.g., pantolactone):

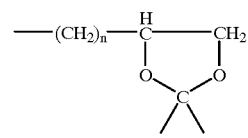

wherein m and n are independently 0, 1, 2, 3, etc.;

cycloalkyl dicarbonylalkyl (cyclic glycerin):

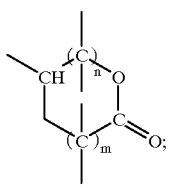

and sulfonylamino wherein R is alkyl, haloalkyl (trifluoromethyl) or cycloalkyl (camphor)

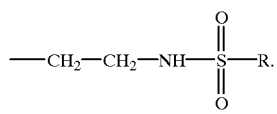

Other suitable photoacid-stable polar groups will be known to those skilled in the art. Particularly preferred groups for use in the present invention include methoxy, acetoxy, methoxyethyl, methylcarbonyloxyethyl, ethoxycarbonyloxyethyl, ethoxydicarbonyloxyethyl and cyano.

As noted above, the polar pendant group $R_p$ in structure (I) may also be —CN or —C(O)—$NR^1R^2$ wherein $R^1$ and $R^2$ are independently selected from the group consisting of hydrogen, lower alkyl and -$(Sp)_{m1}$-$(R_{al})_n$-$(Sp)_{m2}$-$R^*$.

The polar group $R_p$ functions to improve film quality, with respect to both smoothness and adhesion, to enhance thermal properties (as may be evaluated from the glass transition temperature), to improve solubility of the photoresist in industry standard developers, and to improve development of the photoresist while avoid the thinning and swelling that is associated with the presence of excess acid.

Polar monomers for forming the structural units (I) in the copolymer may be prepared using standard techniques of synthetic organic chemistry known to those skilled in the art and/or described in the pertinent literature. Generally, the polar monomers may be prepared by the slow addition of a slight excess of an acid chloride in a suitable solvent, e.g., methylene chloride, tetrahydrofuran, or the like, to a cooled solution of an alcohol in the solvent containing a stoichiometric amount (with respect to the acid chloride) of acid scavenger (generally pyridine or triethylamine). The mixture is allowed to warm to room temperature, and is filtered and washed, e.g., with water, sodium bicarbonate and brine. Removal of the solvent and vacuum distillation from, for example, phenothiazine, will generally give rise to the requisite monomer in 50–90% yield.

Monomeric unit (II), as noted earlier herein, contains a pendant substituent $R_{cl}$ which in turn contains photoacid-cleavable groups. The preferred acid-labile pendant groups $R_{cl}$ contain organic ester groups which undergo a cleavage reaction in the presence of photogenerated acid. Typically, the reaction of acid-labile functional groups with photogenerated acid occurs only, or is promoted greatly by, the application of heat to the film. Those skilled in the art will recognize the various factors which influence the rate and ultimate degree of cleavage of acid-labile functional groups as well as the issues surrounding integration of the cleavage step into a viable manufacturing process. One preferred product of the cleavage reaction is a polymer-bound carboxylic acid group, which, when present in sufficient quantities along the polymer backbone, imparts solubility to the polymer in basic aqueous solutions.

Particularly preferred ester groups are tertiary alkyl esters such as t-butyl esters of carboxylic acids. Other suitable ester groups include alicyclic ester substituents (e.g., $C_7$–$C_{12}$) which are acid-cleavable with tertiary attachment points such as adamantyl, norbornyl or isobornyl derivatives, e.g., 2-methyl-2-adamantyl, 2-methyl-2-isobornyl, 2-methyl-2-tetracyclododecenyl, 2-methyl-2-dihydrodicyclopentadienylcyclohexyl and 1-methylcyclohexyl. However, it will be appreciated by those skilled in the art that a wide range of other acid-labile groups are possible. Examples of such additional acid-sensitive groups are set forth in U.S. Pat. No. 4,491,628 to Ito et al., entitled "Positive- and Negative-Working Resist Compositions with Acid-Generating Photoinitiator and Polymer with Acid Labile Groups Pendant from Polymer Backbone," and the *Handbook of Microlithography, Micromachining, and Microfabrication, Vol. 1: Microlithography,* Ed. P. Raj-Coudhury, p. 321 (1997). Preferred acid-cleavable monomers useful in the practice of the present invention include the t-butyl esters of acrylates and methacrylates.

The polymer may also comprise other monomers to enhance the performance of the photoresist. For example, the polymer may comprise minor amounts of acrylic acid or methacrylic acid monomer (e.g., 5–30%) to enhance development. The polymer may also comprise other suitable monomers such as hydroxystyrene to enhance development and etch resistance or a silicon-containing monomer (e.g., a silicon-containing acrylate or methacrylate) to enhance oxygen plasma etch resistance for bilayer applications. Additional optional monomer units that may be included in the copolymer have the structural formula (III)

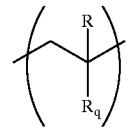

(III)

wherein $R_q$ is

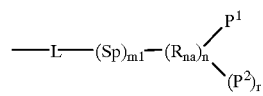

in which $R_{na}$ is a non-alicyclic substituent, and L, Sp, m1, n, r, $P^1$ and $P^2$ are as defined above for the substituents of formula (I). It should also be emphasized that the copolymer may contain two or more different monomer units each having the structure of formula (I), two or more different monomer units each having the structure of formula (II), and, optionally, two or more monomer units having the structure of formula (III). Thus, the copolymer may contain monomer units having as pendant groups —CN, —C(O)—$NR^1R^2$ and

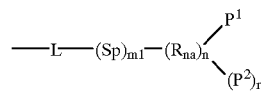

as well as monomer units having two or more different acid-labile ester groups $R_{cl}$, and the like.

The copolymer of the present invention will generally comprise about 25–75 mole % structure (I) monomer units and about 25–75 mole % of structure (II) monomer units. The copolymer can be synthesized using standard free radical solution polymerization techniques known by those skilled in the art and/or described in the pertinent literature.

The Acid Generator

The second component of the resist composition is a photosensitive acid generator. Upon exposure to radiation, the radiation-sensitive acid generator generates a strong acid. A variety of photosensitive acid generators can be used in the composition of the present invention. Generally, suitable acid generators have a high thermal stability (preferably to temperatures greater than 160° C.) so they are not degraded during pre-exposure processing. Suitable acid generators include ionic iodonium sulfonates, e.g., diaryl iodonium (alkyl or aryl) sulfonate and bis-(di-t-butylphenyl) iodonium camphanylsulfonate; aryl (e.g., phenyl or benzyl) triflates and derivatives and analogs thereof, e.g., triphenylsulfonium triflate or bis-(t-butyl phenyl)iodonium triflate; pyrogallol derivatives (e.g., trimesylate of pyrogallol); onium salts such as triarylsulfonium and diaryliodonium hexafluoroantimonates, hexafluoroarsenates, trifluoromethane sulfonates and others; trifluoromethanesulfonate esters of hydroxyimides, $\alpha,\alpha'$-bis-sulfonyl-diazomethanes; sulfonate esters of nitro-substituted benzyl alcohols; naphthoquinone-4-diazides; and alkyl disulfones. Other suitable photoacid generators are disclosed in Reichmanis et al. (1991), *Chemistry of Materials* 3:395. Additional suitable acid generators useful in conjunction with the compositions and methods of the invention will be known to those skilled in the art and/or described in the pertinent literature.

The Resist Composition

The photoresist composition herein comprises both a copolymer as described in detail above, and an acid generator, with the copolymer representing up to about 99 wt. % of the solids included in the composition, and the acid generator representing approximately 0.5–10 wt. % of the solids contained in the composition. Other components and additives may also be present.

For example, the photoresist composition may also include dissolution inhibitors. If dissolution inhibitors are present, they will typically represent in the range of about 1 wt. % to 40 wt. %, preferably about 5 wt. % to 30 wt. %, of the total solids.

Suitable dissolution inhibitors will be known to those skilled in the art and/or described in the pertinent literature. Preferred dissolution inhibitors have high solubility in the resist composition and the solvent used to prepare solutions of the resist composition (e.g., propylene glycol methyl ether acetate, or "PGMEA"), exhibit strong dissolution inhibition, have a high exposed dissolution rate, are transparent at the wavelength of interest, exhibit a moderating influence on $T_g$, strong etch resistance, and display good thermal stability (i.e., stability at temperatures of about 200° C. or greater). Suitable dissolution inhibitors include, but are not limited to, androstane-17-alkylcarboxylates and analogs thereof, wherein the 17-alkylcarboxylate at the 17-position is typically lower alkyl. Examples of such compounds include lower alkyl esters of cholic, ursocholic and lithocholic acid, including methyl cholate, methyl lithocholate, methyl ursocholate, t-butyl cholate, t-butyl lithocholate, t-butyl ursocholate, and the like (see, e.g., Allen et al. (1995) *J. Photopolym. Sci. Technol.*, cited supra); hydroxyl-substituted analogs of such compounds (ibid.); and androstane-17-alkylcarboxylates substituted with 1 to 3 $C_1$–$C_4$ fluoroalkyl carbonyloxy substituents, such as 1-butyl trifluoroacetyllithocholate (see, e.g., U.S. Pat. No. 5,580,694 to Allen et al.).

The remainder of the resist composition is composed of a solvent and may additionally, if necessary or desirable, include customary additives such as dyes, sensitizers, additives used as stabilizers and acid-diffusion controlling agents, coating aids such as surfactants or anti-foaming agents, adhesion promoters and plasticizers.

The choice of solvent is governed by many factors not limited to the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. See, e.g., *Introduction to Microlithography*, Eds. Thompson et al., cited previously. Solvents may generally be chosen from ether-, ester-, hydroxyl-, and ketone-containing compounds, or mixtures of these compounds. Examples of appropriate solvents include cyclopentanone, cyclohexanone, lactate esters such as ethyl lactate, alkylene glycol alkyl ether esters such as propylene glycol methyl ether acetate, alkylene glycol monoalkyl eters such as methyl cellosolve, butyl acetate, 2-ethoxyethanol, and ethyl-3-ethoxypropionate. Preferred solvents include ethyl lactate, propylene glycol methyl ether acetate, and mixtures of the two. The above list of solvents is for illustrative purposes only and should not be viewed as being comprehensive nor should the choice of solvent be viewed as limiting the invention in any way. Those skilled in the art will recognize that any number of solvents or solvent mixtures may be used.

Greater than 50 percent of the total mass of the resist formulation is typically composed of the solvent, preferably greater than 80 percent.

Other customary additives include dyes that may be used to adjust the optical density of the formulated resist and sensitizer which enhance the activity of photoacid generators by absorbing radiation and transferring it to the photoacid generator. Examples include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

A wide variety of compounds with varying basicity may be used as stabilizers and acid-diffusion controlling additives. They may include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene (DBU), guanidines, imides, amides, and others. Ammonium salts may also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed. Surfactants may be used to improve coating uniformity, and include a wide variety of ionic and non-ionic, monomeric, oligomeric, and polymeric species. Likewise, a wide variety of anti-foaming agents may be employed to suppress coating defects. Adhesion promoters may be used as well; again, a wide variety of compounds may be employed to serve this function. A wide variety of monomeric, oligomeric, and polymeric plasticizers such as oligo- and polyethyleneglycol ethers, cycloaliphatic esters, and non-acid reactive steroidally-derived materials may be used as plasticizers, if desired. However, neither the classes of compounds nor the specific compounds mentioned above are intended to be comprehensive and/or limiting. One versed in the art will recognize the wide spectrum of commercially available products that may be used to carry out the types of functions that these customary additives perform.

Typically, the sum of all customary additives will comprise less than 20 percent of the solids included in the resist formulation, preferably, less than 5 percent.

Suitable compositional ranges for the present photoresist are as follows:

| Component | wt. % solids | wt. % total |
|---|---|---|
| Copolymer | 50–99 | 5–50 |
|  | 95–99 preferred (no DI) | 10–20 preferred |
|  | 80–90 preferred (with DI) |  |
| Dissolution Inhibitor (DI) | 1–40, if present | 0.5–5 |
|  | 5–30 preferred | 1–3 preferred |
| Acid Generator | 0.5–10 | 0.05–2 |
|  | 1–5 preferred | 0.1–1 |
| Solvent(s) | NA | 50–95 |
|  |  | 80–90 preferred |
| Other components | 0–20 | 0–4 |
|  | 0.001–5 preferred | 0–1 |

Use in Generation of Resist Images on a Substrate

The present invention also relates to a process for generating a resist image on a substrate comprising the steps of: (a) coating a substrate with a film comprising the resist composition of the present invention; (b) imagewise exposing the film to radiation; and (c) developing the image. The first step involves coating the substrate with a film comprising the resist composition dissolved in a suitable solvent. Suitable substrates are silicon-containing, and include, for example, silicon dioxide, silicon nitride, and silicon oxynitride. The substrate may or may not be coated with an organic anti-reflective layer prior to deposition of the resist composition. Preferably, the surface of the substrate is cleaned by standard procedures before the film is deposited thereon. Suitable solvents for the composition are as described in the preceding section, and include, for example, cyclohexanone, ethyl lactate, and propylene glycol methyl ether acetate. The film can be coated on the substrate using art-known techniques such as spin or spray coating, or doctor blading. Preferably, before the film has been exposed to radiation, the film is heated to an elevated temperature of about 90–150° C. for a short period of time, typically on the order of about 1 minute. The dried film has a thickness of about 0.2–5.0 microns, preferably about 0.3–1.2 microns. In the second step of the process, the film is imagewise exposed to x-ray, electron beam, or ultraviolet radiation, preferably ultraviolet radiation at a wavelength of about 13–250 nm, preferably 193 nm. The preferred radiation source is ArF excimer or KrF excimer. Conveniently, due to the enhanced radiation sensitivity of the resist film, a resist film (1 micron thickness) is fully exposed with less than about 35 mJ/cm$^2$ of radiation, more preferably less than about 25 mJ/cm$^2$. The radiation is absorbed by the radiation-sensitive acid generator to generate free acid which with heating causes cleavage of the acid-cleavable ester substituent and formation of the corresponding acid. Preferably, after the film has been exposed to radiation, the film is again heated to an elevated temperature of about 90–150° C. for a short period of time, on the order of about 1 minute.

The third step involves development of the image with a suitable solvent. Suitable solvents include an aqueous base, preferably an aqueous base without metal ions such as the industry standard developer tetramethyl ammonium hydroxide or choline. The resist composition of the present invention has high radiation sensitivity and provides positive images with high contrast and straight walls. The novel composition can also be readily developed in industry standard developer. Development is without unacceptable thinning or swelling. The resist has suitable thermal properties Tg and good adhesion and planarization. Uniquely, the dissolution property of the composition of the present invention can be varied by simply varying the composition of the polymer. Because the polymer has a very low optical density in the deep UV, the resist composition is uniquely suitable for use in the deep UV, especially at 193 nm.

The composition of the present invention may be used to make an integrated circuit assembly, such as an integrated circuit chip, multichip module, or circuit board. The integrated circuit assembly comprises a circuit formed on a substrate by the steps of. (a) coating a substrate with a film comprising the resist composition of the present invention, (b) imagewise exposing the film to radiation, (c) developing the image to expose the substrate, and (d) forming the circuit in the developed film on the substrate by art-known techniques. After the substrate has been exposed, circuit patterns can be formed in the exposed areas by coating the substrate with a conductive material such as conductive metals by art-known dry-etching techniques such as evaporation, sputtering, plating, chemical vapor deposition, or laser-induced deposition. The surface of the film can be milled to remove any excess conductive material. Dielectric materials may also be deposited by similar means during the process of making circuits. Inorganic ions such as boron, phosphorous, or arsenic can be implanted in the substrate in the process for making p-doped or n-doped circuit transistors. Other means for forming circuits are well known to those skilled in the art.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entirety.

Experimental

The following examples are put forth so as to provide those of ordinary skill in the art with a complete disclosure and description of how to prepare and use the compositions disclosed and claimed herein. Efforts have been made to ensure accuracy with respect to numbers (e.g., amounts, temperature, etc.) but some errors and deviations should be accounted for. Unless indicated otherwise, parts are parts by weight, temperature is in ° C. and pressure is at or near atmospheric. Additionally, all starting materials were obtained commercially or synthesized using known procedures.

EXAMPLE 1

Synthesis of Polymer Containing 2-Trifluoromethanesulfonylaminoethyl Methacrylate 2-Trifluoromethanesulfonylaminoethylmethacrylate (2.00 grams, 0.0076 mole), isobornyl methacrylate (1.70 grams, 0.0076 mole) and t-butyl methacrylate (0.54 gram, 0.0038 mole) were placed with 5 grams of tetrahydrofuran in a round-bottom flask equipped with a condenser and a nitrogen inlet. 2,2'-Azobisisobutyronitrile (0.13 gram) was added to this solution and stirred until completely dissolved. Then, the solution was evacuated with the aid of a Firestone valve and purged with nitrogen. The contents were heated to reflux for 18 hours. Afterwards, the solution was diluted with acetone (25 ml) and added dropwise into deionized water (300 ml). The precipitated polymer was filtered (frit), washed twice with deionized water (26 ml) and dried under vacuum at 60° C. Yield: 3.80 grams.

EXAMPLE 2

Synthesis of Polymer Containing 2-(10-Camphorsulfonylamino)ethyl Methacrylate 2-(Camphorsulfonylamino)ethyl methacrylate (3.43 grams, 0.01 mole), isobornyl methacrylate (2.22 grams, 0.01 mole), t-butyl methacrylate (0.95 gram, 0.0066 mole) and methacrylic acid (0.57 gram, 0.0066 mole) were placed with tetrahydrofuran (12 grams) in a round-bottom flask equipped with a condenser and a nitrogen inlet. 2-2'-Azobisisobutyronitrile (0.13 gram) was added to this solution and stirred until completely dissolved. Then, the solution was evacuated with the aid of a Firestone valve and purged with nitrogen. The contents were then heated to reflux for 18 hours. Afterwards, the solution was diluted with acetone (25 ml) and added dropwise into deionized water (600 ml). The precipitated polymer was filtered (frit), washed twice with deionized water (50 ml) dried under vacuum at 60° C. Yield: 6.72 grams.

EXAMPLE 3

Synthesis of Polymer Containing Pantolactone Methacrylate

Pantolactone methacrylate (3.47 grams, 0.0175 mole), isobornyl methacrylate (5–56 grams, 0.025 mole) and methacrylic acid (0.65 gram, 0.0075 mole) were placed with 30 grams of tetrahydrofuran (THF) in a round bottom flask equipped with a condenser and a nitrogen inlet. 2,2'-azobisisobutyronitrile (AIBN) (0.33 gram) was added to this solution and stirred until completely dissolved. Then, the solution was evacuated with the aid of a Firestone valve and purged with nitrogen. The contents were heated to reflux for 18 hours. Afterwards, the solution was diluted with acetone (30 ml) and added dropwise into hexanes (600 ml). The precipitated polymer was filtered (frit), washed twice with hexanes (50 ml) and dried under vacuum at 60° C. Yield: 8.09 grams.

EXAMPLE 4

Synthesis of Methacrylate Copolymer

A 100 mL 3-neck round-bottomed flask was equipped with a magnetic stirrer, temperature-controlled mantle, thermowell with thermocouple, and a condenser connected to a nitrogen/vacuum inlet. The flask was charged with 7.0 grams 5-(4-)cyano-2-norbornyl methacrylate (synthesized using a modification of the procedures reported by Kawakami et al. (1991), Kokai No. 02/193,958, abstracted in *Chem. Abstr.* 114:62960u), 4.45 g 2'-acetoxyethyl methacrylate, 4.515 grams 1-butyl methacrylate, 2.227 grams methacrylic acid, and 54.6 g isopropyl alcohol. The mixture was deoxygenated by repeated short vacuum/nitrogen purge cycles, then heated to approximately 60° C. 2,2'-Azobisisobutyronitrile (AIBN) (0.386 grams) was added, the mixture was further deoxygenated with 3 short vacuum/nitrogen purges, and the reaction was brought to a gentle reflux for 5.5 hours. On cooling, the contents were precipitated into 3 L hexanes. The precipitated solid was collected on a filter, washed successively with 5×150 mL aliquots of hexanes, and dried in a vacuum oven at 50° C. overnight. Following drying, 17.57 grams of a white powder was obtained.

EXAMPLE 5

Synthesis of Methacrylate Copolymer

A 100 mL 3-neck round-bottomed flask was equipped with a magnetic stirrer, temperature-controlled mantle, thermowell with thermocouple, and a condenser connected to a nitrogen/vacuum inlet. The flask was charged with 5.153 grams 5-(4-)cyano-2-norbornyl methacrylate, 1.288 grams methacrylonitrile, 2.403 grams t-butyl methacrylate, 1.317 grams methacrylic acid, and 10.2 grams isopropyl alcohol. The mixture was deoxygenated by repeated short vacuum/nitrogen purge cycles, then heated to approximately 60° C. 2,2'-Azobisisobutyronitrile (AIBN) (0.252 g) was added, the mixture was further deoxygenated with 3 short vacuum/nitrogen purges, and the reaction was brought to a gentle reflux for 2 hours. An additional 6 mL isopropyl alcohol and 0.252 grams AIBN were added after 2 hours; the mixture was heated at gentle reflux for another 4 hours and an additional 13 mL isopropyl alcohol was judiciously added in portions to keep the mixture fluid during this time. On cooling 10 mL acetone was added to the contents to suppress polymer precipitation. The resulting solution was precipitated into 2.5 L hexanes. The precipitated solid was collected on a filter, washed successively with 3×200 mL aliquots of hexanes, and dried in a vacuum oven at 50° C. overnight. Following drying, 10.21 grams of a white powder was obtained.

EXAMPLE 6

Synthesis of Methacrylate Copolymer

A 100 mL 3-neck round-bottomed flask was equipped with a magnetic stirrer, temperature-controlled mantle, thermowell with thermocouple, and a condenser connected to a nitrogen/vacuum inlet. The flask was charged with 12.83 grams 5-(4-)cyano-2-norbornyl methacrylate, 5.33 grams t-butyl methacrylate, 2.15 grams methacrylic acid, and 37 grams isopropyl alcohol. The mixture was deoxygenated by repeated short vacuum/nitrogen flush cycles, then heated to ca. 75° C. Azobisisobutyronitrile (AIBN) (0.411 g) was added, the mixture was further deoxygenated with a vacuum/nitrogen flush, and the reaction was brought to a gentle reflux for 6 hours and an additional 20 mL isopropyl alcohol was judiciously added in portions to keep the mixture fluid during this time. On cooling 30 mL acetone was added to the contents to suppress polymer precipitation. On cooling, the contents were precipitated into 3 L hexanes. The precipitated solid was collected on a filter, washed successively with 3×100 mL aliquots of hexanes, and dried in a vacuum oven at 60C overnight. Following drying, 19.54 grams of a white powder was obtained.

EXAMPLE 7

Evaluation of Resist Performance

A resist composition was prepared with the photoacid generator triphenylsulfonium hexafluoroantimonate and a copolymer of isobornyl methacrylate (50%) and 2'-acetoxyethyl methacrylate. The resist composition was dissolved in PGMEA and spin-coated on a silicon wafer with a film thickness of 0.8 microns. The film was heated to 150° C. for 1 minute, exposed to 193 nm (30–35 mJ/cm$^2$) and baked at 150° C. for 1 minute. The resist was developed in 0.26N tetramethylammonium hydroxide to give clean images.

EXAMPLE 8

Positive Two-Component Photoresist Formulation

The polymer of Example 4 was used in this example, along with 4,4'-bis(t-butylphenyl)iodonium nonafluorobutanesulfonate as the photoacid generator ("PAG").

Synthesis of 4,4'-bis-(t-butylphenyl)iodonium nonafluorobutanesulfonate: To 500 ml, methylene chloride and 300 mL water in a round-bottomed flask equipped with an efficient magnetic stirrer were added 190 g 4,4'-bis-(t-butylphenyl)iodonium acetate and 150 g potassium nonafluorobutanesulfonate. The mixture was stirred for 24 hours. Additional methylene chloride, water and ethanol were added to break the emulsion. The methylene chloride layer was collected and washed twice with water, then neutralized with 10 drops NH$_4$OH. Following a final water wash, the methylene chloride solution was dried over magnesium sulfate, then filtered and evaporated. The resulting solids were recrystallized from isopropanol/heptanes, collected, and dried in a vacuum oven at 65° C. to yield 265 g of 4,4'-bis-(t-butylphenyl)iodonium nonafluorobutanesulfonate.

A 10 percent solution by weight of polymer in PGMEA was prepared. A 5.0 gram portion of this solution was added to 12.5 mg PAG. Following dissolution of the PAG, the mixture was filtered repeatedly through a 0.45 μm Teflon membrane filter. The resulting resist solution was coated on silicon wafers treated with an organic anti-reflective coating (ARC; Brewer Sciences DUV-30) according to the ARC manufacturer's specifications. Coating was carried out using standard solution spin-casting means. Following coating, the resulting film was baked at 120° C. for 60 seconds. Exposure of selected portions of this film to incrementally increasing doses of 193 nm radiation was conducted using an ISI Technologies ArF Microstep device. Following exposure, the film was heated at 120° C. for 60 seconds. The film was cooled to ambient temperature, then immersed in 0.21 N aqueous tetramethylammonium hydroxide (Shipley MF-321) for 10 s. Following development, the film was rinsed with water, then dried under a stream of air. Inspection of the array of exposed portions of the film using an interferometric film-thickness measuring device (Nanometrics Inc. Nanospec/AFT) indicated that substantially complete dissolution of the film occurred within a dose range beginning at 11 mJ/cm$^2$ and extending to at least 40 mJ/cm$^2$, but that incomplete dissolution or no dissolution at all occurred at doses less than 11 mJ/cm$^2$.

Exposure of another film of the same photoresist formulation to patterned 193 nm radiation using the ArF Microstep device was carried out. In this case, the freshly spun film was baked at 120° C. prior to exposure. An exposure range of 22–30 mJ/cm$^2$ was selected; following exposure, the film was heated at 120° C. for 60 s. The film was cooled to ambient temperature, then immersed in 0.21 N aqueous tetramethylammonium hydroxide (Shipley MF-321) for 10 s. Following development, the film was rinsed with water, then dried under a stream of air. Inspection of the array of patterned images by optical and electron microscopy indicated that the resist was capable of resolving fine features (0.35 to 0.25 μm line structures) within the specified exposure range.

EXAMPLE 9

Positive Three-Component Photoresist Formulation

The polymer of Example 4 was used in this example. A polymer solution was prepared by dissolving 3.9 grams solid polymer in 26.1 grams propylene glycol methyl ether acetate (PGMEA). A 5.0 gram portion of the resulting solution was added to 26 mg 4,4'-bis(t-butylphenyl)iodonium nonafluorobutanesulfonate and 65 mg t-butyl ursodeoxycholate. Following dissolution of the iodonium salt PAG and dissolution inhibitor, the mixture was filtered repeatedly through a 0.45 μm Teflon membrane filter. The resulting resist solution was coated on silicon wafers treated with an organic anti-reflective coating (ARC; Brewer Sciences DUV-30) according to the ARC manufacturer's specifications. Coating was carried out using standard solution spin-casting means. Following coating, the resulting film was baked at 110° C. for 60 s. Exposure of selected portions of this film to incrementally increasing doses of 193 nm radiation was conducted using an ISI Technologies ArF Microstep device. Following exposure, the film was heated at 130° C. for 60 s. The film was cooled to ambient temperature, then immersed in 0.21 N aqueous tetramethylammonium hydroxide (Shipley MF-321) for 10 s. Following development, the film was rinsed with water, then dried under a stream of air. Inspection of the array of exposed portions of the film using an interferometric film-thickness measuring device (Nanometrics Inc. Nanospec/AFT) indicated that substantially complete dissolution of the film occurred within a dose range beginning at 7 mJ/cm$^2$ and extending to at least 20 mJ/cm$^2$, but that incomplete dissolution or no dissolution at all occurred at doses less than 7 mJ/cm$^2$.

Exposure of another film of the same photoresist formulation to patterned 193 nm radiation using the ArF Microstep device was carried out. In this case, the freshly spun film was baked at 110° C. prior to exposure. An exposure range of 15–20 mJ/cm$^2$ was selected; following exposure, the film was heated at 130° C. for 60 s. The film was cooled to ambient temperature, then immersed in 0.21 N aqueous tetramethylammonium hydroxide (Shipley MF-321) for 10 s. Following development, the film was rinsed with water, then dried under a stream of air. Inspection of the array of patterned images by optical and electron microscopy indicated that the resist was capable of resolving fine features (0.35 to 0.25 μm line structures) within the specified exposure range.

EXAMPLE 10

Positive Two-Component Photoresist Formulation

The polymer of Example 5 was used in this example. A polymer solution was prepared by dissolving 3.9 grams solid polymer in 26.1 grams propylene glycol methyl ether acetate (PGMEA). A 3.3 grams portion of the resulting solution was added to 17.2 mg 4,4'-bis(t-butylphenyl)iodonium nonafluorobutanesulfonate. Following dissolution of the iodonium salt PAG, the mixture was filtered repeatedly through a 0.45 μm Teflon membrane filter. The resulting resist solution was coated on silicon wafers treated with an organic anti-reflective coating (ARC; Brewer Sciences DUV-30) according to the ARC manufacturer's specifications. Coating was carried out using standard solution spin-casting means. Following coating, the resulting film was baked at 13° C. for 60 s. Exposure of selected portions of this film to incrementally increasing doses of 193 nm radiation was conducted using an ISI Technologies ArF Microstep device. Following exposure, the film was heated at 150° C. for 60 s. The film was cooled to ambient temperature, then immersed in 0.21 N aqueous tetramethylammonium hydroxide (Shipley MF-321) for 10 s. Following development, the film was rinsed with water, then dried under a stream of air. Inspection of the array of exposed portions of the film using an interferometric film-thickness measuring device (Nanometrics Inc. Nanospec/AFT) indicated that substantially complete dissolution of the film occurred within a dose range beginning at 18 mJ/cm$^2$ and extending to at least 50 mJ/cm$^2$, but that incomplete dissolution or no dissolution at all occurred at doses less than 18 mJ/cm$^2$.

Exposure of another film of the same photoresist formulation to patterned 193 nm radiation using the ArF Microstep device was carried out. In this case, the freshly spun film was baked at 130° C. prior to exposure. An exposure range of 36–50 mJ/cm$^2$ was selected; following exposure, the film was heated at 150° C. for 60 s. The film was cooled to ambient temperature, then immersed in 0.21 N aqueous tetramethylammonium hydroxide (Shipley MF-321) for 10 s. Following development, the film was rinsed with water, then dried under a stream of air. Inspection of the array of patterned images by optical and electron microscopy indicated that the resist was capable of resolving fine features (0.35 to 0.25 μm line structures) within the specified exposure range.

EXAMPLE 11

Positive Three-Component Photoresist Formulation

The polymer of Example 5 was used in this example. A polymer solution was prepared by dissolving 3.9 grams solid polymer in 26.1 grams propylene glycol methyl ether acetate (PGMEA). A 3.3 gram portion of the resulting solution was added to 17.2 mg 4,4'-bis(tbutylphenyl)iodonium nonafluorobutanesulfonate and 42.9 mg t-butyl lithocholate. Following dissolution of the iodonium salt PAG and dissolution inhibitor, the mixture was filtered repeatedly through a 0.45 μm Teflon membrane filter. The resulting resist solution was coated on silicon wafers treated with an organic anti-reflective coating (ARC; Brewer Sciences DUV-30) according to the ARC manufacturer's specifications. Coating was carried out using standard solution spin-casting means. Following coating, the resulting film was baked at 130° C. for 60 s. Exposure of selected portions of this film to incrementally increasing doses of 193 nm radiation was conducted using an ISI Technologies ArF Microstep device. Following exposure, the film was heated at 150° C. for 60 s. The film was cooled to ambient temperature, then immersed in 0.21 N aqueous tetramethylammonium hydroxide (Shipley MF-321) for 10 s. Following development, the film was rinsed with water, then dried under a stream of air. Inspection of the array of exposed portions of the film using an interferometric film-thickness measuring device (Nanometrics Inc. Nanospec/AFT) indicated that substantially complete dissolution of the film occurred within a dose range beginning at 16 mJ/cm$^2$ and extending to at least 50 mJ/cm$^2$, but that incomplete dissolution or no dissolution at all occurred at doses less than 16 mJ/cm$^2$.

Exposure of another film of the same photoresist formulation to patterned 193 nm radiation using the ArF Microstep device was carried out. In this case, the freshly spun film was baked at 130° C. prior to exposure. An exposure range of 32–45 mJ/cm$^2$ was selected; following exposure, the film was heated at 150° C. for 60 s. The film was cooled to ambient temperature, then immersed in 0.21 N aqueous tetramethylammonium hydroxide (Shipley MF-321) for 10 s. Following development, the film was rinsed with water, then dried under a stream of air. Inspection of the array of patterned images by optical and electron microscopy indicated that the resist was capable of resolving fine features (0.35 to 0.25 μm line structures) within the specified exposure range.

EXAMPLE 12

Positive Two-Component Photoresist Formulation

The polymer of Example 6 was used in this example. A polymer solution was prepared by dissolving 3.9 grams solid polymer in 26.1 grams propylene glycol methyl ether acetate (PGMEA). A 5.0 gram portion of the resulting solution was added to 26.0 mg 4,4'-bis. (t-butylphenyl)iodonium nonafluorobutanesulfonate. Following dissolution of the iodonium salt PAG, the mixture was filtered repeatedly through a 0.45 μm Teflon membrane filter. The resulting resist solution was coated on silicon wafers treated with an organic anti-reflective coating (ARC; Brewer Sciences DUV-30) according to the ARC manufacturer's specifications. Coating was carried out using standard solution spin-casting means. Following coating, the resulting film was baked at 140° C. for 60 s. Exposure of selected portions of this film to incrementally increasing doses of 193 nm radiation was conducted using an ISI Technologies ArF Microstep device. Following exposure, the film was heated at 150° C. for 60 s. The film was cooled to ambient temperature, then immersed in 0.21 N aqueous tetramethylammonium hydroxide (Shipley MF-321) for 20 s. Following development, the film was rinsed with water, then dried under a stream of air. Inspection of the array of exposed portions of the film using an interferometric film-thickness measuring device (Nanometrics Inc. Nanospec/AFT) indicated that substantially complete dissolution of the film occurred within a dose range beginning at 7.5 mJ/cm$^2$ and extending to at least 25 mJ/cm$^2$, but that incomplete dissolution or no dissolution at all occurred at doses less than 7.5 mJ/cm$^2$.

Exposure of another film of the same photoresist formulation to patterned 193 nm radiation using the ArF Microstep device was carried out. In this case, the freshly spun film was baked at 130° C. prior to exposure. An exposure range of 15–25 mJ/cm$^2$ was selected; following exposure, the film was heated at 150° C. for 60 s. The film was cooled to ambient temperature, then immersed in 0.21 N aqueous tetramethylammonium hydroxide (Shipley MF-321) for 20 s. Following development, the film was rinsed with water, then dried under a stream of air. Inspection of the array of patterned images by optical and electron microscopy indicated that the resist was capable of resolving fine features (0.35 to 0.25 μm line structures) within the specified exposure range.

What is claimed is:

1. A lithographic photoresist composition comprising a radiation-sensitive acid generator and a copolymer comprising a first monomer unit having a pendant group containing an organic polar moiety that is photoacid-stable, non-acidic and non-hydroxylic, and a second monomer unit having a pendant group that is photoacid-cleavable, wherein the first monomer unit has the structural formula (I)

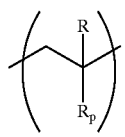
(I)

wherein:
R is hydrido or methyl; and
$R_p$ is selected from the group consisting of

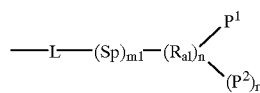
(a)

wherein L is a linking moiety selected from the group consisting of —C(O)O—, —C(O)—, —O—C(O)—C(O)—O— and —OC(O)—, Sp selected from the group consisting of alkylene, cycloalkylene and oxyalkylene optionally substituted with a lower alkoxy group or a lower alkyl ester, m1 is 0 or 1, $R_{al}$ is a saturated alicyclic moiety containing 6 to 12 carbon atoms, n is 0 or 1, $P^1$ and $P^2$ may be the same or different and are each defined as -(Sp)$_{m2}$-R*, m2 is 0 or 1, r is 0 or 1, and R* is a polar organic group that is acid-stable, non-acidic and non-hydroxylic, and contains a heteroatom with a Pauling electronegativity greater than about 3.00, or wherein $P^1$ and $P^2$ are linked to form a cyclic structure containing R*, (b) —C(O)—NR$^1$R$^2$ wherein R$^1$ and R$^2$ are independently selected from the group consisting of hydrogen, lower alkyl and -(Sp)$_{m1}$-(R$_{al}$)$_n$-(Sp)$_{m2}$-R* wherein Sp, $R_{al}$, R*, m1, m2 and n are as defined above, and (c) —CN, and
the second monomer unit has the structural formula (II)

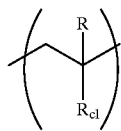
(II)

wherein:
R is hydrido or methyl; and
$R_{cl}$ comprises a photoacid-cleavable ester substituent.

2. The composition of claim 1, wherein $R_p$ is -(L)-(Sp)$_{m1}$-(R$_{al}$)$_n$-(Sp)$_{m2}$-R*.

3. The composition of claim 2, wherein L is —C(O)O—, Sp is lower alkylene or lower oxyalkylene optionally substituted with a lower alkoxy group or a lower alkyl ester, m1 is 0, m2 is 0 or 1, and n is 1.

4. The composition of claim 2, wherein L is —C(O)O—, m1 and m2 are 0, and n is 1.

5. The composition of claim 2, wherein R* is methoxy, acetoxy, alkoxyethyl, alkoxycarbonyloxyethyl, alkoxydicarbonyloxyethyl or cyano.

6. The composition of claim 3, wherein R* is methoxy, acetoxy, alkoxyethyl, alkoxycarbonyloxyethyl, alkoxydicarbonyloxyethyl or cyano.

7. The composition of claim 1, wherein $R_p$ is —C(O)—NR$^1$R$^2$.

8. The composition of claim 1, wherein $R_p$ is —CN.

9. The composition of claim 1, wherein the copolymer comprises at least two different monomeric units having the structural formula (I).

10. The composition of claim 9, wherein the copolymer comprises (a) monomeric units of formula (I) wherein $R_p$ is -(L)-(Sp)$_{m1}$-(R$_{al}$)$_n$-(Sp)$_{m2}$-R* and (b) monomeric units of formula (I) wherein $R_p$ is —CN.

11. The composition of claim 9, wherein the copolymer comprises (a) monomeric units of formula (I) wherein $R_p$ is -(L)-(Sp)$_{m1}$-(R$_{al}$)$_n$-(Sp)$_{m2}$-R* and (b) monomeric units of formula (I) wherein $R_p$ is —C(O)—NR$^1$R$^2$.

12. The composition of claim 1, wherein the copolymer further comprises acrylic acid, methacrylic acid, or both.

13. The composition of claim 1, wherein the copolymer further comprises hydroxystyrene monomer units.

14. The composition of claim 1, wherein the copolymer further comprises silicon-containing acrylate and/or methacrylate monomer units.

15. The composition of claim 1, wherein the copolymer further comprises monomeric units having the structure of formula (III)

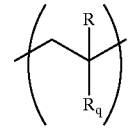
(III)

wherein $R_q$ is

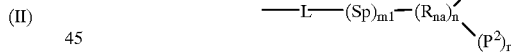

in which $R_{na}$ is a non-alicyclic substituent.

16. The composition of claim 1, further including an effective amount of a dissolution inhibitor.

17. The composition of claim 16, wherein the dissolution inhibitor is selected from the group consisting of: lower alkyl esters of cholic acid, lithocholic acid and ursocholic acid; hydroxyl-substituted lower alkyl esters of cholic acid, lithocholic acid and ursocholic acid; and androstane-17-alkylcarboxylate having 1 to 3 $C_1$–$C_4$ fluoroalky carbonyloxy substituents.

18. The composition of claim 17, wherein the dissolution inhibitor is t-butyl trifluoroacetyl lithocholate.

* * * * *